(12) United States Patent
Park et al.

(10) Patent No.: US 10,224,516 B2
(45) Date of Patent: Mar. 5, 2019

(54) METHOD FOR DEPOSITING ORGANIC MATERIAL FOR ORGANIC LIGHT EMITTING DEVICE

(71) Applicant: DAWONSYS CO., LTD., Gyeonggi-do (KR)

(72) Inventors: Sun Soon Park, Gyeonggi-do (KR); Hae Ryong Lee, Gyeonggi-do (KR); Sung Hoon Jee, Daejeon (KR); Won Eui Hong, Gyeonggi-do (KR); Tae Ho Cho, Gyeonggi-do (KR); Doo Jung Park, Seoul (KR)

(73) Assignee: Dawonsys Co., Ltd., Gyeonggi-do (KR)

(*) Notice: Subject to any disclaimer, the term of this patent is extended or adjusted under 35 U.S.C. 154(b) by 0 days.

(21) Appl. No.: 15/597,175

(22) Filed: May 17, 2017

(65) Prior Publication Data

US 2018/0183013 A1    Jun. 28, 2018

(30) Foreign Application Priority Data

Dec. 22, 2016   (KR) .................. 10-2016-0176943

(51) Int. Cl.
 *H01L 51/00* (2006.01)
 *H01L 51/56* (2006.01)
 *H01L 51/50* (2006.01)

(52) U.S. Cl.
 CPC .......... *H01L 51/56* (2013.01); *H01L 51/0003* (2013.01); *H01L 51/5056* (2013.01); *H01L 51/5072* (2013.01)

(58) Field of Classification Search
 CPC . H01L 51/56; H01L 51/0003; H01L 51/5056; H01L 51/5072
 See application file for complete search history.

(56) References Cited

U.S. PATENT DOCUMENTS

| 4,769,292 A | * | 9/1988 | Tang | ................... H01L 51/0064 313/504 |
| 5,851,709 A | * | 12/1998 | Grande | .............. B41M 5/38214 257/E31.121 |

(Continued)

FOREIGN PATENT DOCUMENTS

| KR | 1020120041573 | 5/2012 |
| KR | 1020150139748 | 12/2015 |
| KR | 10-2016-0134529 | 11/2016 |

*Primary Examiner* — Nikolay Yushin
(74) *Attorney, Agent, or Firm* — Stuart H. Mayer; Mayer & Williams PC

(57) ABSTRACT

The present invention relates to method for depositing an organic material for an organic light emitting device and an organic light emitting device manufactured thereby. The method includes the steps of: applying a premix in which a host and a dopant are premixed, to a first donor substrate; heating the premix by applying an electric field to the first donor substrate; depositing the host and the dopant separated into different layers on a second donor substrate, with the host or the dopant having a relatively low vaporization temperature first deposited from the premix onto the second donor substrate and then the dopant or the host having a relatively high vaporization temperature deposited later onto the second donor substrate; heating the host and the dopant by applying an electric field to the second donor substrate; and depositing the host and the dopant that are uniformly mixed on a target substrate.

5 Claims, 4 Drawing Sheets

(56) References Cited

U.S. PATENT DOCUMENTS

| | | | | |
|---|---|---|---|---|
| 5,937,272 A | * | 8/1999 | Tang | H01L 27/3211 438/158 |
| 6,555,284 B1 | * | 4/2003 | Boroson | H01L 51/001 430/200 |
| 6,695,029 B2 | * | 2/2004 | Phillips | H01L 51/0013 156/379.6 |
| 2003/0148208 A1 | * | 8/2003 | Phillips | H01L 51/0013 430/200 |
| 2004/0067302 A1 | * | 4/2004 | Burberry | H01L 51/0013 427/66 |
| 2013/0047920 A1 | * | 2/2013 | Ro | H01L 51/56 118/641 |

* cited by examiner

METHOD FOR DEPOSITING ORGANIC MATERIAL FOR ORGANIC LIGHT EMITTING DEVICE

BACKGROUND

Field

The present invention relates to a method for depositing an organic material for an organic light emitting device and an organic light emitting device manufactured thereby, and more particularly to a method for depositing an organic material for an organic light emitting device that is capable of uniformly depositing an organic material on a target substrate and an organic light emitting device manufactured thereby.

Related Technology

An organic light-emitting diode (OLED) is a semiconductor device that directly changes electrical energy to light energy to cause self-luminescence, and has been attracting a great deal of attention as a next generation display following a liquid crystal display (LCD), based on a lot of advantages such as a high response rate, a low driving voltage, a wide viewing angle, low power consumption, a high luminous efficiency, light weight and low thickness.

The principle of operation of an organic light-emitting diode is briefly described as follows. Electrons injected through a cathode and holes injected through an anode are recombined in an (low molecular or polymer) organic thin film, excitons generated during the recombination transition to the ground state and visible light corresponding to the energy gap of the light-emitting layer material is emitted. The materials used for the light-emitting layer may have various colors such as red, green and blue, and a combination of these colors can emit light of a desired color.

In the organic light-emitting diode as described above, according to a large number of previous studies, it is known that the luminance characteristics can be improved as the mixing uniformity of the hosts and the dopants in the light-emitting layer is increased.

However, organic materials comprising hosts and dopants are generally mixed with each other in a liquid state, wherein a phenomenon of partially uneven mixing occurs. This partially uneven mixing causes a problem of low luminance characteristics during a final deposition on a target substrate.

SUMMARY

The present invention has been made to solve these problems by providing a method for depositing an organic material for an organic light emitting device and an organic light emitting device manufactured thereby. The method uses two donor substrates that are capable of performing a planar deposition by joule heating and depositing hosts and dopants that are uniformly mixed on a final target substrate, thereby greatly increasing the luminous efficiency and enabling the manufacture of large area organic light emitting devices such as OLED lighting.

According to an aspect of the present invention, there is provided a method for depositing an organic material for an organic light emitting device. The method includes the steps of: (S1) applying a premix in which a host and a dopant are premixed for an organic light emitting device, to a first donor substrate; (S2) heating the premix by applying an electric field to the first donor substrate; (S3) depositing the host and the dopant that are separated into different layers onto a second donor substrate, with the host or the dopant having a relatively low vaporization temperature being first deposited from the premix onto the second donor substrate and then the dopant or the host having a relatively high vaporization temperature being deposited later onto the second donor substrate; (S4) heating the host and the dopant by applying an electric field to the second donor substrate; and (S5) depositing the host and the dopant that are uniformly mixed on a target substrate, wherein in the step (S5), even if the host or the dopant that are deposited earlier on the second donor substrate reaches their vaporization temperature, the earlier-deposited host or dopant is prevented from being deposited by the dopant or the host that are deposited later on the second donor substrate, and when the later-deposited dopant or host reaches their vaporization temperature, the earlier-deposited host or dopant and the later-deposited host or dopant are uniformly mixed together and deposited on the target substrate.

The host and the dopant may be deposited from the first donor substrate onto the second donor substrate in a bottom-up manner, and the host and the dopant may be deposited from the second donor substrate onto the target substrate in a top-down manner.

The step (S1) of applying the premix may include the step of applying the premix on an upper surface of the first donor substrate by spraying with a nozzle.

The step (S2) of heating the premix may include the step of joule heating the premix by applying electric power to a first heat transfer layer that is formed on an upper surface of the first donor substrate.

The step (S4) of heating the host and the dopant may include the step of joule heating the host and the dopant by applying electric power to a second heat transfer layer that is formed on a lower surface of the second donor substrate.

The host may be a single or multiple polymer comprising at least one material, and the dopant may include at least a luminescent dopant, a phosphorescent dopant, a fluorescent dopant, a red luminescent dopant R, a green luminescent dopant G, and a blue luminescent dopant B, a tricolor dopant, a white dopant and combinations thereof, which matches the host.

According to another aspect of the present invention, there is provided an organic light emitting device manufactured by the above-described method.

According to embodiments of the present invention, there is provided a method for depositing an organic material for an organic light emitting device and an organic light emitting device manufactured thereby. The method uses two donor substrates that are capable of performing a planar deposition by joule heating and depositing hosts and dopants that are uniformly mixed on a final target substrate, thereby greatly increasing the luminous efficiency and enabling the manufacture of large area organic light emitting devices such as OLED lighting. Of course, the scope of the present invention is not limited by these effects.

EXPLANATION OF REFERENCE NUMERALS

Figure 1:
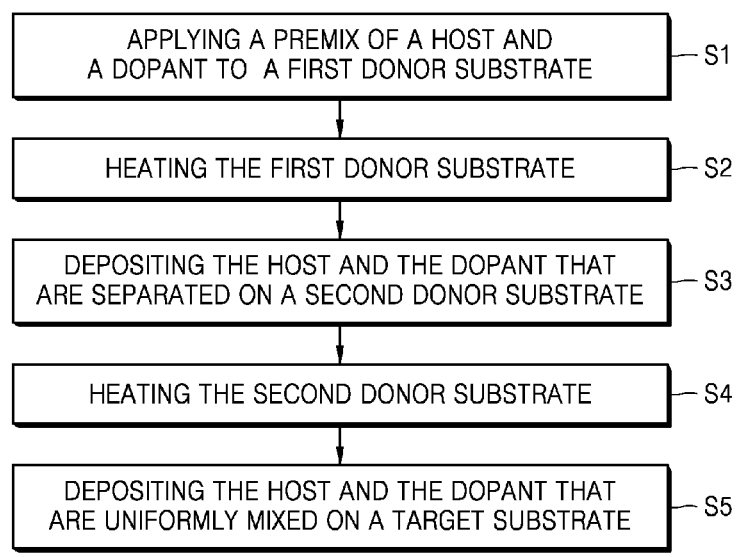
FIG. 1 is a flowchart showing a method for depositing an organic material for an organic light emitting device according to an embodiment of the present invention.

1: host
2: dopant
3: premix
10: first donor substrate
11: first heat transfer layer
12: first body
20: second donor substrate
21: second heat transfer layer
22: second body
30: target substrate
N: nozzle

DETAILED DESCRIPTION

Hereinafter, embodiments of the present invention will be described in detail with reference to the accompanying drawings.

These embodiments are described in sufficient detail to enable those skilled in the art to make the invention. The following embodiments may be modified in many different forms but the scope of the present invention is not limited to the embodiments set forth herein. Rather, these embodiments are provided so that this disclosure will be more thorough and complete, and will fully convey the scope of the invention to those skilled in the art. Furthermore, in the drawings, the thickness and size of each layer are exaggerated for convenience and clarity of explanation.

The terminology used herein is for the purpose of describing particular embodiments only and is not intended to limit the invention. As used herein, the singular forms "a," "an," and "the" include the plural forms as well, unless the context clearly indicates otherwise. Furthermore, the terms "comprises" and/or "comprising" when used herein should be interpreted as specifying the presence of stated shapes, numbers, steps, operations, elements, and/or groups thereof, but do not exclude the presence or addition of one or more other shapes, numbers, operations, elements, components, and/or groups thereof.

Embodiments of the present invention will now be described with reference to the drawings schematically illustrating ideal embodiments of the present invention. In the drawings, for example, variations in the shape may be expected, depending on the manufacturing technique and/or tolerance. Therefore, embodiments of the present invention should not be construed as limited to any particular shape of the regions illustrated herein, but should include variations in shape resulting, for example, from manufacturing.

Hereinafter, a method for depositing an organic material for an organic light emitting device and an organic light emitting device according to some embodiments of the present invention will be described in detail with reference to the drawings.

FIG. 1 is a flowchart showing a method for depositing an organic material for an organic light emitting device according to an embodiment of the present invention. FIGS. 2 to 6 are cross-sectional views sequentially illustrating the deposition process of an organic material for an organic light emitting device according to an embodiment of the present invention.

As shown in FIGS. 1 to 6, a method for depositing an organic material for an organic light emitting device according to an embodiment of the present invention includes the steps of: (S1) applying a premix of host and dopant on a first donor substrate, (S2) heating the first donor substrate, (S3) depositing the host and the dopant that are separated into different layers on a second donor substrate, (S4) heating the second donor substrate, and (S5) depositing the host and the dopant that are uniformly mixed on a target substrate.

Figure 2:
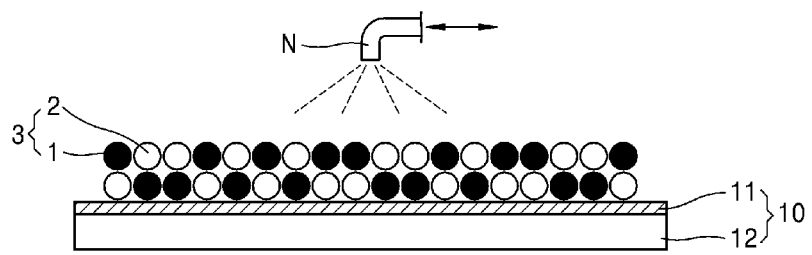
FIG. 2 is a cross-sectional view sequentially illustrating the deposition process of an organic material for an organic light emitting device according to an embodiment of the present invention.

For example, as shown in FIG. 2, the step (S1) of applying a premix of host and dopant to a first donor substrate may be the step of applying a premix 3 for an organic light emitting device, in which the host 1 and the dopant 2 are premixed, on the first donor substrate 10.

More specifically, for example, as shown in FIG. 2, step (S) of applying the premix 3 on the first donor substrate 10 may include the step of applying the premix 3 on an upper surface of the first donor substrate 10, by spraying with a nozzle N.

However, the present invention is not limited to spraying, and various types of application methods such as various inkjet methods, printing methods, and stamping methods can be applied.

Furthermore, for example, a bipolar compound having both a hole transport unit and an electron transport unit may be used as the host material. The hole transport unit is a unit containing a functional group having excellent hole-transport capability, and examples thereof include a unit containing a fluorene derivative, a unit containing a carbazole derivative, a unit containing a dibenzothiophene derivative, or a unit containing a dibenzofuran derivative. The electron transport unit is a unit containing a functional group having excellent electron-transport capability and may, for example, be a unit containing a pyridine derivative, a unit containing a pyrimidine derivative, or a unit containing a triazine derivative.

When a bipolar compound having both the hole transport unit and the electron transport unit is used as the host material, the electron control layer may cause imbalance of holes and electrons in the host material in the low-luminance region, thereby lowering the luminous efficiency. However, embodiments of the present invention can prevent the deterioration of luminous efficiency by a method to be described later.

Furthermore, a mixture of a bipolar compound having both the hole transport unit and the electron transport unit and a compound having at least a hole transport unit may be used as the host material. When a compound having at least a hole transport unit other than the bipolar compound is added as the host material, the hole characteristics of the host material may become larger and therefore imbalance of holes and electrons in the host material in the low-luminance region becomes larger, thereby further lowering luminous efficiency. The mixing ratio of the bipolar compound and the compound having at least a hole transport unit may be 1:1 to 1:9. If the mixing ratio of the bipolar compound and the compound having at least a hole transport unit falls within the above range, the imbalance of holes and electrons in the host material can be further increased. Embodiments of the present invention can prevent the deterioration of luminous efficiency due to such unevenness by a method to be described later.

In addition, the dopant material may be any one of Ir, Pt, Pd, and Os complexes, and may be a known metal complex. The Ir, Pt, Pd, or Os complexes are well known in the art and, accordingly, detailed descriptions thereof will be omitted.

Figure 3:
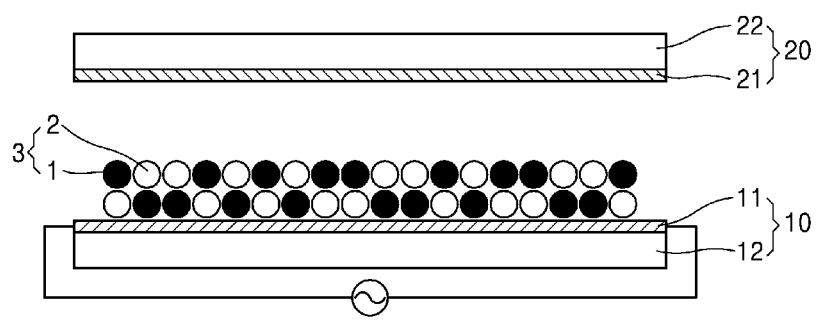
FIG. 3 is a cross-sectional view sequentially illustrating the deposition process of an organic material for an organic light emitting device according to an embodiment of the present invention.

Then, as shown in FIG. 3, the step (S2) of heating the first donor substrate 10 may be the step of heating the premix 3 by applying an electric field to the first donor substrate 10.

More particularly, for example, as shown in FIG. 3, the step (S2) of heating the premix 3 by applying an electric field to the first donor substrate 10 may include the step of joule heating the premix 3 by applying electric power to a first heat transfer layer 11 that is formed on an upper surface of a first body 12 of the first donor substrate 10. Here, the joule heating refers to a heating method in which an object to be heated is heated by joule heat generated when a current flows through a resistor.

Here, when the hosts 1 and the dopants 2 are deposited from the first donor substrate 10 onto the second donor substrate 20, the deposition may be performed in a bottom-up manner such that the hosts 1 and the dopants 2 are separated into different layers on the second donor substrate 20 using the force of gravity and the rate of evaporation. However, the present invention is not limited to this, and the deposition may be performed in a top-down manner, an inclined manner, a lateral manner, or the like.

Figure 4:
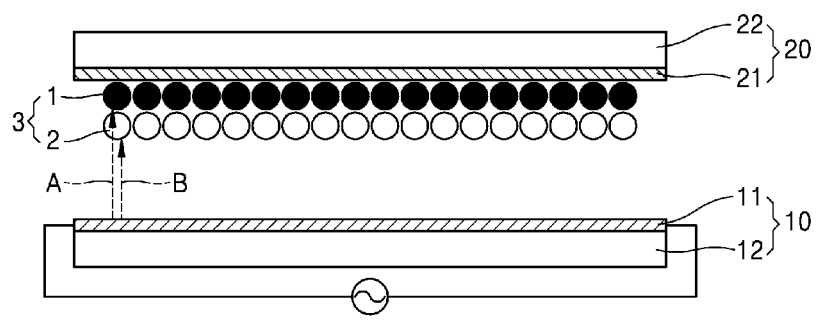
FIG. 4 is a cross-sectional view sequentially illustrating the deposition process of an organic material for an organic light emitting device according to an embodiment of the present invention.

Then, as shown in FIG. 4, the step (S3) of depositing the host and the dopant that are separated into different layers on the second donor substrate may include the step of depositing the hosts 1 and the dopants 2 separated into different layers on the second donor substrate 20 by depositing the hosts 1 or the dopants 2 having a relatively low vaporization temperature from the premix 3 onto the second donor substrate 20 and then depositing the dopants 2 or the hosts 1 having a relatively high vaporization temperature onto the second donor substrate 20.

Here, as indicated by the dotted arrow A in FIG. 4, the hosts 1 having a relatively low vaporization temperature may be first deposited from the heated premix 3 onto the second donor substrate 20, and then the dopants 2 having a relatively high vaporization temperature may be deposited later on the second donor substrate 20, to be separated into different layers.

The reason for this separation into different layers is that the preliminary work for uniform mixing, which will be described later, can be carried out by performing a preliminary separation prior to uniform mixing.

Therefore, even if the hosts 1 and the dopants 2 are unevenly premixed on the above-described first donor substrate 10, they can be structurally separated into different layers on the second donor substrate 10 such that the simultaneous and uniform deposition to be described later is prepared.

Figure 5:
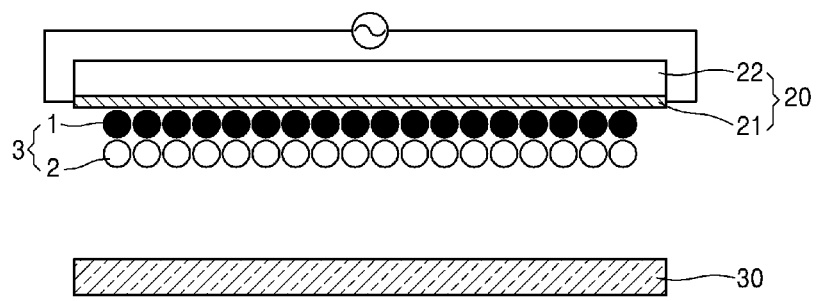
FIG. 5 is a cross-sectional view sequentially illustrating the deposition process of an organic material for an organic light emitting device according to an embodiment of the present invention.

Next, as shown in FIG. 5, the step (S4) of heating the second donor substrate may include the step of heating the hosts 1 and the dopants 2 by applying an electric field to the second donor substrate 20.

More specifically, for example, as shown in FIG. 5, the step (S4) of heating the hosts 1 and the dopants 2 by applying an electric field to the second donor substrate 20 may include the step of joule heating the hosts 1 and the dopants 2 by applying electric power to a second heat transfer layer 21 that is formed on a lower surface of a second body 22 of the second donor substrate 20. Here, the joule heating refers to a heating method in which an object to be heated is heated by joule heat generated when a current flows through a resistor.

Here, when the hosts 1 and the dopants 2 are deposited from the second donor substrate 20 onto the target substrate 30, the deposition may be performed in a top-down manner such that the hosts 1 and the dopants 2 simultaneously fall while being mixed using the force of gravity.

Figure 6:
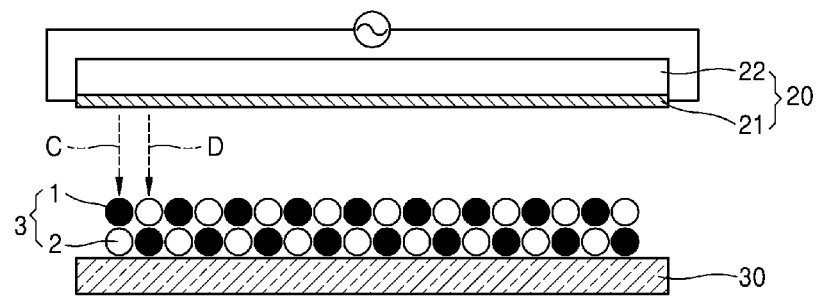
FIG. 6 is a cross-sectional view sequentially illustrating the deposition process of an organic material for an organic light emitting device according to an embodiment of the present invention.

Next, as shown in FIG. 6, in the step (S5) of depositing the hosts and the dopants that are uniformly mixed on a target substrate, even if the hosts 1 or the dopants 2 that are deposited earlier on the second donor substrate 20 reach their vaporization temperature, they may be prevented from being deposited by the dopants 2 or the hosts 1 that are deposited later on the second donor substrate 20. Then, when the later-deposited dopants 2 or hosts 1 reach their vaporization temperature, the earlier-deposited hosts or dopants and the later-deposited hosts or dopants may be uniformly mixed together and deposited on the target substrate 30.

Here, for example, since the dopants 2 or the hosts 1 that are deposited later on the second donor substrate 20 do not vaporize first, the hosts 1 or the dopants 2 that are deposited earlier on the second donor substrate 20 are not deposited even if they reach their vaporization temperature.

Then, when the dopants 2 or the hosts 1 that are deposited later on the second donor substrate 20 reach their vaporization temperature, as indicated by the dotted arrows C and D in FIG. 6, the hosts 1 and the dopants 2 are uniformly mixed together and deposited instantaneously onto the target substrate 30.

Therefore, the hosts 1 and the dopants 2 can be uniformly mixed with each other and deposited on the final target substrate 30 by using the two donor substrates 10 and 20 that are capable of performing a planar deposition by joule heating. This serves to greatly increase the luminous efficiency and enable the manufacture of large area organic light emitting devices such as OLED lighting.

Figure 7:
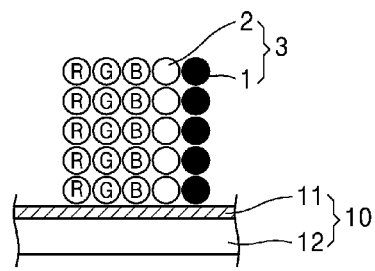
FIG. 7 is a cross-sectional view sequentially showing a method for depositing an organic material for an organic light emitting device according to another embodiment of the present invention.
Figure 8:
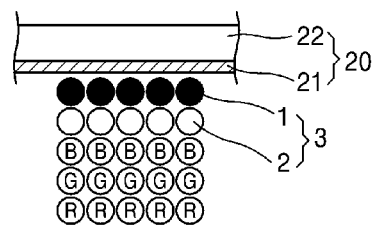
FIG. 8 is a cross-sectional view sequentially showing a method for depositing an organic material for an organic light emitting device according to another embodiment of the present invention.
Figure 9:
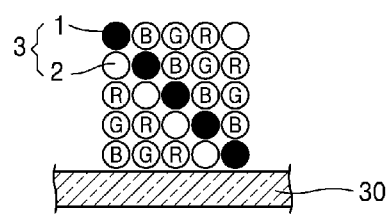
FIG. 9 is a cross-sectional view sequentially showing a method for depositing an organic material for an organic light emitting device according to another embodiment of the present invention.

FIGS. 7 to 9 are cross-sectional views sequentially showing a method for depositing an organic material for an organic light emitting device according to another embodiment of the present invention.

As shown in FIGS. 7 to 9, the host 1 and the dopant 2 are not necessarily limited to a single host and a single dopant. For example, multiple dopants and a single host may be provided or multiple dopants and multiple hosts may be used.

That is, the host 1 may be a single or multiple polymer comprising at least one material and the dopant 2 may include at least a luminescent dopant, a phosphorescent dopant, a fluorescent dopant, a red luminescent dopant R, a green luminescent dopant G, and a blue luminescent dopant B, a tricolor dopant, a white dopant and combinations thereof, which matches the host 1.

More particularly, for example, as shown in FIG. 7, in the above-described step (S1), the host 1 that is applied to the first donor substrate 10 may be a single host and the dopant 2 may include a red luminescent dopant R, a green luminescent dopant G, and a blue luminescent dopant B.

Here, as described above, the mixing uniformity in the liquid state is very low and the hosts and the dopants of the same type, respectively, may exist in an agglomerated state as shown in FIG. 7.

Then, as shown in FIG. 8, in the above-described step (S3), the hosts 1 and the dopants 2, i.e. red luminescent dopants R, green luminescent dopants G, blue luminescent dopants B, etc., that are deposited onto the second donor substrate 20 can be separated into different layers according to the vaporization temperatures.

Then, as shown in FIG. 9, in the above-described step (S5), the hosts 1 and the dopants 2, i.e. red luminescent dopants R, green luminescent dopants G, blue luminescent dopants B, etc., that are finally deposited on the target substrate 30 can be evenly mixed with high uniformity without being clustered together.

Figure 10:
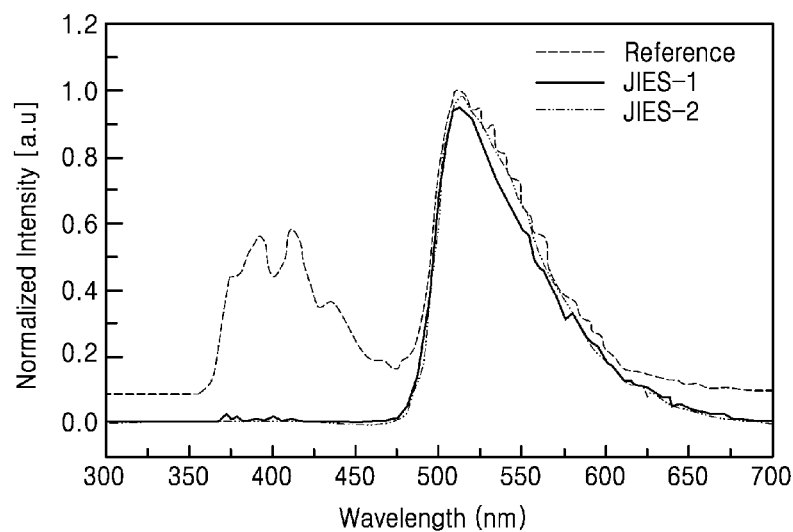
FIG. 10 is a graph showing a spectrum of light generated in an organic light emitting device manufactured according to embodiments of the present invention.

FIG. 10 is a graph showing a spectrum of light generated in an organic light emitting device manufactured according to embodiments of the present invention.

Therefore, as indicated by the solid line in FIG. 10, the spectrum of the light generated in the organic light emitting device manufactured according to embodiments of the present invention shows a single peak and therefore has a relatively high luminous efficiency in the desired wavelength range compared with those of the conventional organic light emitting devices indicated by the dotted lines in FIG. 10.

The present invention is not limited to the above-described method and may include any organic light emitting device manufactured by any of the above-described methods.

While the present invention has been described with reference to embodiments thereof, it is to be understood that the invention is not limited to the disclosed embodiments. A person of ordinary skill in the art will understand that various modifications and equivalent arrangements can be made without departing from the spirit and scope of the appended claims. Therefore, the true scope of the present invention should be determined by the technical idea of the appended claims.

The invention claimed is:

1. A method for depositing an organic material for an organic light emitting device, the method comprising the steps of:
    (S1) applying a premix in which a host and a dopant are premixed for an organic light emitting device, to a first donor substrate;
    (S2) heating the premix by applying an electric field to the first donor substrate;
    (S3) depositing the host and the dopant that are separated into different layers onto a second donor substrate, with the host or the dopant having a relatively low vaporization temperature being first deposited from the premix onto the second donor substrate and then the dopant or the host having a relatively high vaporization temperature being deposited later onto the second donor substrate;
    (S4) heating the host and the dopant by applying an electric field to the second donor substrate; and
    (S5) depositing the host and the dopant that are uniformly mixed on a target substrate,
    wherein in the step (S5), even if the host or the dopant that are deposited earlier on the second donor substrate reaches their vaporization temperature, the earlier-deposited host or dopant is prevented from being deposited by the dopant or the host that are deposited later on the second donor substrate, and when the later-deposited dopant or host reaches their vaporization temperature, the earlier-deposited host or dopant and the later-deposited host or dopant are uniformly mixed together and deposited on the target substrate,
        wherein the host and the dopant are deposited from the first donor substrate onto the second donor substrate in a bottom-up manner, and
        wherein the host and the dopant are deposited from the second donor substrate onto the target substrate in a top-down manner.

2. The method of claim 1,
    wherein the host is a single or multiple polymer comprising at least one material, and
    wherein the dopant includes at least a luminescent dopant, a phosphorescent dopant, a fluorescent dopant, a red luminescent dopant R, a green luminescent dopant G, and a blue luminescent dopant B, a tricolor dopant, a white dopant and combinations thereof, which matches the host.

3. The method of claim 1,
    wherein the step (S1) of applying the premix includes the step of applying the premix on an upper surface of the first donor substrate by spraying with a nozzle.

4. The method of claim 3,
    wherein the step (S2) of heating the premix includes the step of joule heating the premix by applying electric power to a first heat transfer layer that is formed on an upper surface of the first donor substrate.

5. The method of claim 4,
    wherein the step (S4) of heating the host and the dopant includes the step of joule heating the host and the dopant by applying electric power to a second heat transfer layer that is formed on a lower surface of the second donor substrate.

* * * * *